(12) United States Patent
Dutton et al.

(10) Patent No.: US 6,850,418 B2
(45) Date of Patent: Feb. 1, 2005

(54) IMPACT RESISTANT ELECTRONIC DATA MODULE HOUSING

(75) Inventors: Thomas F. Dutton, Florence, VT (US); Jay Cross, Chesterland, OH (US)

(73) Assignee: TimeKeeping Systems, Inc., Solon, OH (US)

( * ) Notice: Subject to any disclaimer, the term of this patent is extended or adjusted under 35 U.S.C. 154(b) by 0 days.

(21) Appl. No.: 10/247,791

(22) Filed: Sep. 19, 2002

(65) Prior Publication Data

US 2004/0057217 A1 Mar. 25, 2004

(51) Int. Cl.$^7$ ................................................. H05K 5/06
(52) U.S. Cl. ...................... 361/752; 361/680; 200/284; 200/292; 200/293
(58) Field of Search .......................... 361/752, 748, 361/730, 736, 753, 680; 439/76.1; 200/1 B, 5 A, 512–517, 510, 292, 293–296, 237, 238, 200, 302.1, 302, 284, 341, 345

(56) References Cited

U.S. PATENT DOCUMENTS

| | | | | |
|---|---|---|---|---|
| 3,735,068 A | * | 5/1973 | Yanaga et al. | ............... 200/512 |
| 4,117,438 A | * | 9/1978 | Kim et al. | ..................... 336/75 |
| 4,604,509 A | * | 8/1986 | Clancy et al. | .............. 200/513 |
| 4,839,474 A | * | 6/1989 | Hayes-Pankhurst et al. | 200/5 A |
| 4,945,217 A | | 7/1990 | Bolan | |
| 4,982,371 A | | 1/1991 | Bolan et al. | |
| 5,051,548 A | * | 9/1991 | Underwood et al. | ...... 200/11 D |
| 5,245,147 A | * | 9/1993 | Kobayashi | .................. 200/250 |
| D377,647 S | | 1/1997 | Fekete et al. | |
| 5,834,834 A | | 11/1998 | Lee et al. | |
| 6,016,255 A | | 1/2000 | Bolan et al. | |
| 6,191,955 B1 | | 2/2001 | Guillot et al. | |
| 6,313,826 B1 | * | 11/2001 | Schrum et al. | ............. 345/161 |

* cited by examiner

Primary Examiner—David Martin
Assistant Examiner—Thanh S. Phan
(74) Attorney, Agent, or Firm—James A. Hudak

(57) ABSTRACT

The present invention generally relates to an impact and temperature resistant housing that also resists being removed from its fixed mounting position. Additionally, the present invention resists being fashioned into a weapon if it is removed from its mounted position. In general, the present invention comprises a base section, conical section, terminal support section, and corresponding center terminal.

13 Claims, 3 Drawing Sheets

IMPACT RESISTANT ELECTRONIC DATA MODULE HOUSING

TECHNICAL FIELD

The present invention generally relates to an encapsulated housing for an electronic touch memory button and related circuitry. Specifically, the present invention provides a rigid, impact resistant housing that encapsulates a touch button and corresponding electrical components, such as a circuit board. This housing is designed so that its shape provides excellent resiliency against external forces. The housing of the present invention also serves to impede one's ability to forcibly remove the housing from its mounted position.

BACKGROUND OF THE INVENTION

Electronic touch memory button terminals are used for a variety of purposes, and generally comprise a metallic housing module, which includes circuit components therein. The assembly forms a touch memory button with the electronic components contained in the housing, wherein the housing can then be mounted in a desired location for use. The touch memory button terminals can be used in a variety of ways, such as for applications including inventory control, machinery maintenance records, retail tagging, guard tour systems or the like.

The touch memory buttons are typically mounted to a wall or other surface using a mounting device. The touch memory buttons are configured such that a conductive terminal is formed on a top surface of the touch memory button assembly. In this and other possible applications, the electronic data module provides terminal connections, which can be contacted by the user to communicate with the electronic component package therein. As an example, a host system could read/write access such touch button modules by contacting a terminal provided thereby with a suitable reader. In many cases, a hand-held wand will provide the contact with the electronic touch memory button module, by contacting the electronic terminal by pressing a contact on the wand against the terminal. The manual contacting of the electronic terminal connects the reader with the electronic component package to communicate information therebetween. As merely an example of suitable touch memory buttons with which the present invention could be used, Dallas Semiconductors produces electronic data modules of this type, and corresponding reading devices such as that described. Examples of such devices are described for example in U.S. Pat. Nos. 4,945,217 and 4,982,371. Other touch button or electronic data module configurations are also contemplated to be used in the present invention.

A specific application of the present invention is in association with the invention described in U.S. patent application Ser. No. 09/419,475 entitled "Guard Tour System" which is hereby incorporated herein by reference. The invention described is directed toward a system for use by security guards or the like, to monitor rounds of a property or the like by guards. The system comprises a variety of electronic hardware components and software. The electronic hardware includes one or more touch button readers; one or more downloaders for use with the touch button readers, and a plurality of electronic data modules or touch memory buttons located throughout a facility. Each electronic data module may comprise a housing according to the present invention, and may include electronic circuit components that may be preprogrammed with information specific to its particular location. The system may use electronic wands, which are touched to the electronic terminal associated with the data module, that are mounted in association with the housing on a wall or corridor along a guard's surveillance route or as desired for another application. Each electronic data module may contain preprogrammed information specific to its particular location in addition to a variety of other desired information. As a guard progresses through the route, the guard uses an electronic wand to read or transmit information from or to each touch memory button.

The guard tour system as described is generally directed toward security applications, but can also be used in a plurality of applications in which regular checks of various conditions are made and verified. For example, the system can be used to insure regular checks of fire extinguishers throughout a facility. In this example each fire extinguisher would include a touch memory button fastened to its exterior. The touch memory button is encapsulated by an impact resistant housing, and would include information identifying the particular fire extinguisher in almost an identical manner to the system using touch memory buttons along a guard control path. Any application utilizing touch buttons could utilize the present invention, such as systems including but not limited to, equipment checks, maintenance checks, hotels, restaurants, supermarket and/or restroom cleaning checks, patient checks in hospitals, or any other application.

The memory buttons may be used in a variety of other applications and settings, such as a prison, correctional facility, or other type of facilities or environments. Because the button may be used in various setting where it may be exposed to tampering or damage, it would be desirable to have a button housing to eliminate or minimize tampering or damage to the devices. Additionally, it would be desirable to provide for mounting of an electronic data module or touch memory button, such that damage from application of external forces that may be imparted on the device are eliminated or minimized. Further, it is desired that a housing for an electronic data module be capable of withstanding an unauthorized attempt to remove the module from its mounted position. Finally, it would be desirable to provide an electronic data module or touch memory button housing, which is temperature resistant, and able to withstand extreme temperatures from an incendiary device. It would also be desirable to provide an electronic data module housing which protects the electrical components from transient electrical signals or the like.

SUMMARY OF THE INVENTION

Based upon the foregoing, it is an object of the present invention to provide an electronic data module housing which enhances protection of the module and which resists being destroyed by external forces and extreme temperatures, as well as resisting being removed from its mounted position.

The housing is designed to have a profile, which inhibits damaging the electronic terminal and electrical components mounted in the housing. In an embodiment, the housing is formed as a frustoconical structure comprised an outer housing and an electronic terminal assembly accessible from the exterior thereof. The housing may be formed from plastic, metal, composite material or any other type of material that is suitable for forming such a housing. Depending on the environment the device is to be used in, the structural integrity of the material can be shown to withstand possible forces or conditions in a particular environment. As an example, a stainless steel outer housing may be used. In an embodiment of the present invention, the housing is comprised of a plurality of concentric sections that are integrated together to form a single unified housing. The housing may comprise a mounting section having a plurality of mounting bores, which extend through the mounting section, and having a conical section extending from the mounting section toward a central recess providing an electronic terminal support section. An electronic terminal is mounted in the support section, and is in electrical connection with the electrical circuit components mounted in the housing. Surrounding the interior of the terminal support section is a dielectric insulator that serves to electronically isolate the terminal. The housing forms a cavity created by the frustoconical section to provide a region for electrical components, such as a circuit board, mounted in electrical isolation.

DETAILED DESCRIPTION OF THE INVENTION

Figure 1:
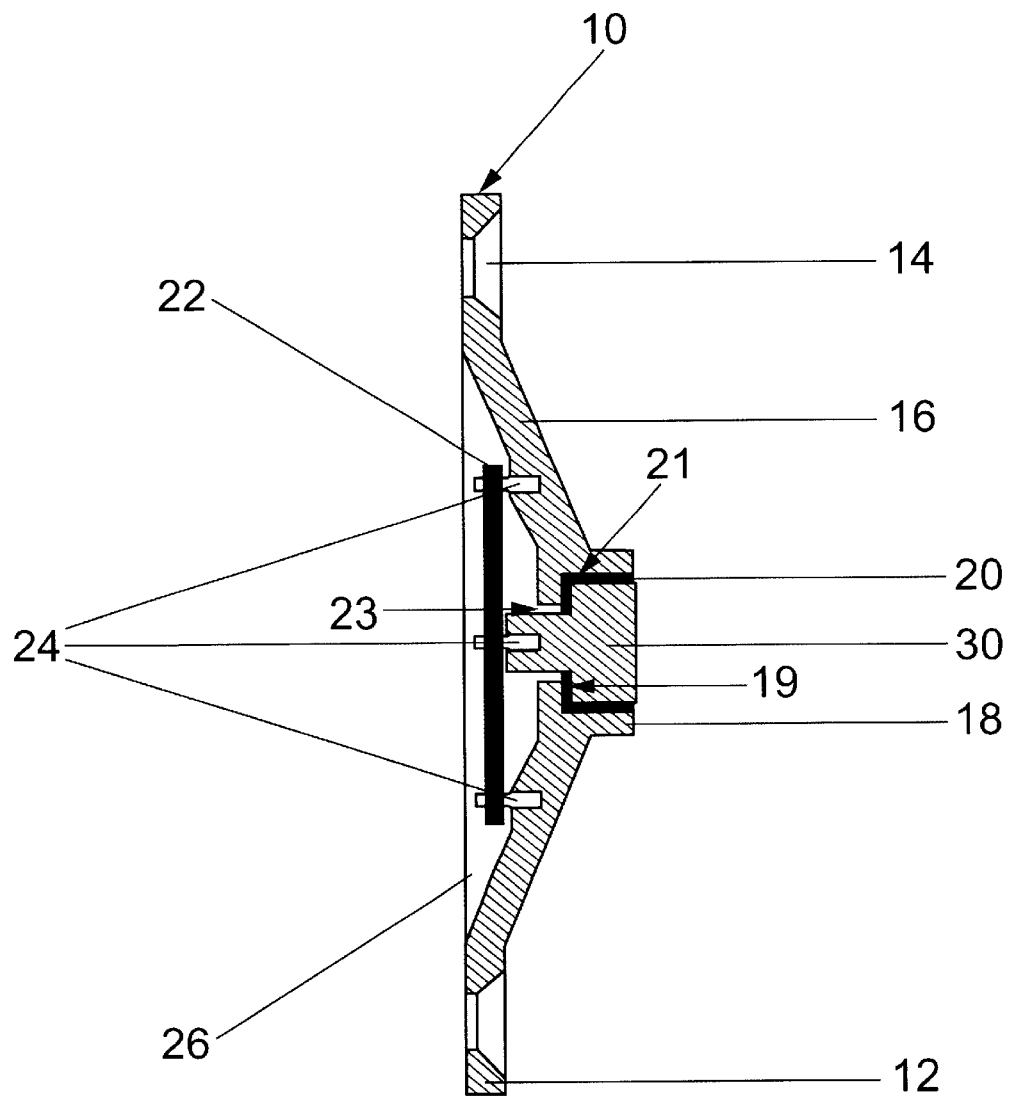
FIG. 1 is a cross-sectional view of the present invention.
Figure 2:
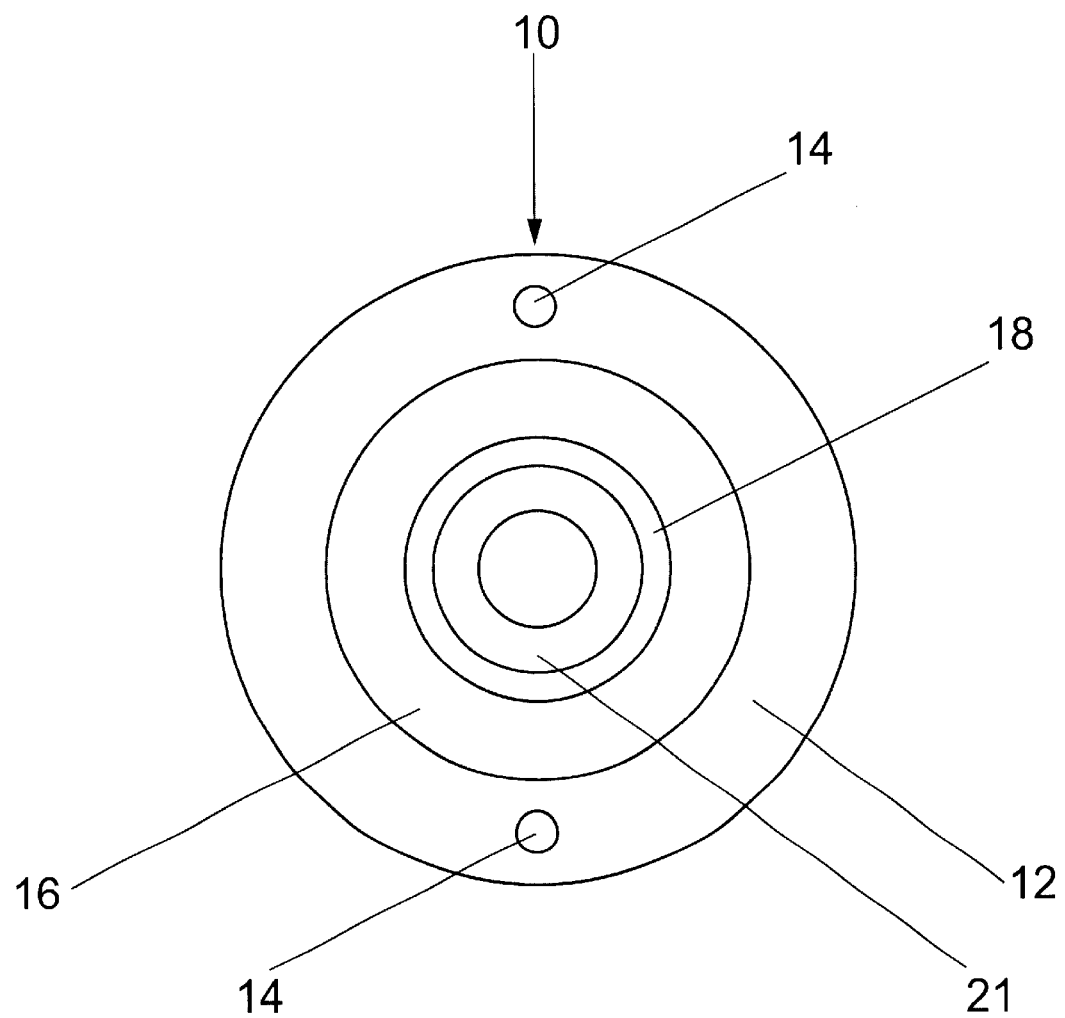
FIG. 2 is a top elevational view of the present invention.
Figure 3:
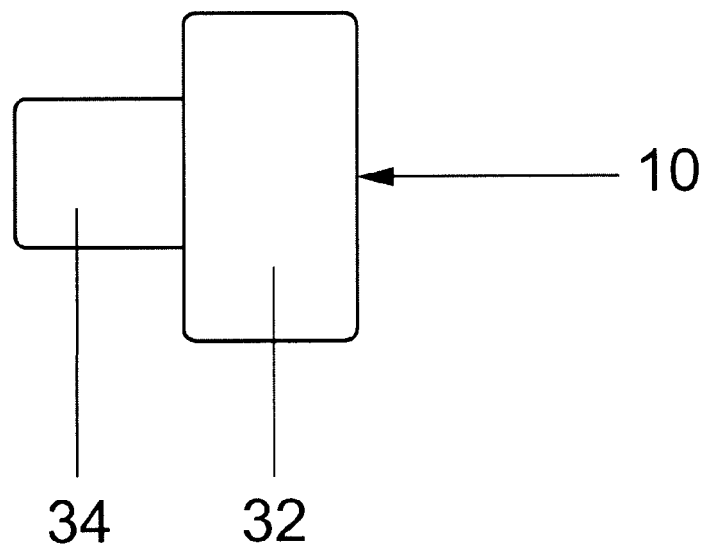
FIG. 3 is a side elevational view of center terminal of the present invention.

Turning to FIGS. 1–3, there is illustrated an embodiment of the present invention, or electronic data module housing 10. The housing 10 comprises a mounting section 12, a frustoconical section 16, and a terminal support section 18. The mounting section 12 is a substantially disk-shaped, planar surface that has one or more mounting bores 14, which extend through the surface of the mounting section 12, and allow a securing device such as a screw, nail, bolt, or other similar means to be used to secure the housing 10 to a wall, door, or any other suitable area. Additionally, the mounting section 12 may take on any form or shape that is suitable for the particular application. It is also contemplated that at least one bore 14 is designed, such that the head of the fastener used to mount the present invention 10 is flush or counter sunk with respect to the top of the surface of the mounting section 12. Thus, because the amount of edges or protrusions of the housing 10 are reduced, it is difficult for an unauthorized individual to achieve any leverage, or to grab on to, or to attach a tool onto the housing 10. As a result, the housing 10 is made resistant to being removed from its mounted position unless desired. Moreover, the present invention may be mounted at a desired location using glue, epoxy, or another suitable adhesive or like material.

The frustoconical section 16 is substantially sloped and extends upwardly from the mounting surface in a low profile configuration. Depending on the mounting surface, the angle (i.e. shallowness/steepness) of the conical section 16, as well as the height that the conical section 16 extends from the mounting section 12 can vary. At the apex of the conical section 16 is a terminal support section 18 which may be substantially cylindrical in shape. The terminal support section 18 extends generally perpendicularly with respect to the mounting section 12, and forms a cavity 21 at the apex for positioning and protecting a terminal 30. The terminal 30 may be formed as a solid piece of stainless steel, and provides one of the two electrical connections between a reader (not shown) and the electronic circuitry on the printed circuit board (PCB) 22. Another terminal is provided by the housing section 18 adjacent the terminal 30. The terminal support section 18 may further comprise a supporting surface generally indicated at 19, which extends inwardly from section 18. The supporting surface 19 facilitates proper positioning of terminal 30, and supports the terminal 30 in association with housing 10, particularly against impacts on terminal 30. The supporting surface 19 also comprises an opening 23 therein, being a central opening in the embodiment shown. The opening 23 provides access from the terminal cavity 21 to an interior enclosed cavity 26 formed adjacent a mounting surface by housing 10. The terminal cavity 21 is lined with a dielectric material 20 that serves to encapsulate and electrically isolate the electronic center terminal 30, disposed within the terminal support cavity 21. The member 20 may be a nylon washer or other suitable material, which in conjunction with the terminal 30, may be press fit into the terminal support section 18. The material from which member 20 is made could be any suitable insulating material. Further, the entire assembly could be molded in place, glued, or otherwise mechanically fastened. The terminal 30 may also be held in position within the insulating material member 20 by any type of suitable adhesive, or in other suitable and known manners.

As noted form the above, the terminals provided by terminal 30 and housing section 18, have a shape and dimension to allow any reader capable of reading conventional touch memory buttons to communicate with the electronics mounted in association with the PCB 22. Any part of the housing 10 in the area of section 18, can serve as a terminal for connection to the PCB via electrical connectors 24. The base section 12, conical section 16, and the terminal support section 18 are preferably integrally formed from the same material such as plastic, metal, composite, or any other suitable material. Alternatively, these sections could be constructed individually from various materials and suitably joined together via welding, thermo-welding, adhesives or any other suitable means of connecting the individual sections together. The material chosen to comprise the base section 12, the conical section 16, and the terminal support section 18 is impact resistant and is capable of withstanding a variety of external forces, which may be directed toward the housing 10. If the material chosen were not electrically conductive, a further electrical contact would be provided to allow communication with the reader.

The housing of the present invention 10 forms cavity 26 in conjunction with a mounting surface, which is fully enclosed and protected from the external environment. The cavity 26 forms a mounting space for the printed circuit board 22. The PCB 22 is connected to terminal 30 and conductive housing 10 in the area of section 18 by electrical connectors 24, used to operatively connect terminal 30 for operation as controlled by circuit components on PCB 22. This cavity 26 provides sufficient area such that the circuit board 22 does not extend beyond the bottom of the base section 12, thus allowing the present invention 10 to be mounted directly to a desired mounting surface. On the PCB 22, electronic components, such as a circuit component produced by Dallas Semiconductor, referred to as the Dallas DS2401Z (Silicon Serial No.), which is similar circuitry to that used in typical touch memory buttons produced by Dallas Semiconductor. Further, a transient voltage suppressor circuit, such as produced by General Semiconductor as Model TGL41-6.8, may provide transient voltage protection for the other circuit components, such as may be supplied from a 9 Volt battery or other sources.

FIG. 3 illustrates a side view of the electronic terminal 30, which the housing 10 is designed to mount in an impact resistant configuration. The cavity 21 created by the terminal support section 18 provides a secure and sturdy support for the terminal 30. The terminal 30 may comprise a top section 32 and a bottom section 34. The top section 32 is preferably mounted so as to be substantially flush with the top portion of the terminal support section 18. In this manner, a person using a portable data reading/transfer device can transfer or receive electronic data through the outwardly facing surface of terminal 30. The mounting configuration protects both the terminal 30 as well as circuit board 22 within the impact resistant housing 10. To further facilitate protecting the circuit components, once the circuit board 22 is mounted in association with terminal 30 within cavity 26, the cavity can be filled with a potting compound, such as a hard epoxy, for potting of the circuitry within housing 10. The hard epoxy potting compound will secure the connection between the circuit board 22 and terminal 30, and protect the circuitry from external environmental elements, such as moisture, heat or the like. The potting of the electrical circuit components also protects the circuitry from possible electrical interference with other electrical devices. The configuration also incorporates electrical protection from external voltage sources, such as typical 9-volt battery or the like. The housing 10 is designed to prevent abuse from deliberate impacts, as well as possible damage from heat sources or the like. The low profile configuration of the housing 10 provides a more secure mounting of an electronic data module or touch memory button assembly and associated circuit components for various applications in which electronic data modules may be used. For use in a guard tour system as described, the ruggedized electronic data module configuration reduces the ability for the terminal and related circuit components to be damaged in the environments in which the devices are used, such as security facilities, prisons or the like. The low profile housing configurations reduces the ability to remove the housing from its mounted position, while making the terminal easily accessible for interrogation by a hand-held reader or the like. It should also be understood that while a particular embodiment of the present invention has been shown and described herein, various alternatives could also be made, such as in the mounting of the terminal in association with the housing. As an example, a standard Dallas Semiconductor touch memory button could be mounted (perhaps even by the end user) inside the housing 10, from the rear of housing 10, with the cavity 21 configured to retain the standard memory button in the desired position. In such an embodiment, the housing 10 would not be completely filled with a potting compound to allow access from the rear of the housing 10. In this case, the housing 10 would protect the standard touch memory button and may also be configured to provide transient voltage protection. The button could therefore be installed much like a battery is installed into a watch, providing protection for the housing in which the standard button is packaged. Current buttons are thin and fragile, accordingly such a configuration would take this into account. Further, although the housing 10 has been shown to have a substantially circular configuration, other shapes may be used for a desired application or environment.

The foregoing disclosure is illustrative of the present invention, and is not to be construed as limiting thereof. Although an embodiment of the invention has been described, persons of ordinary skill in the art will readily appreciate that numerous modifications could be made without departing from the scope and spirit of the disclosed invention. As such, it should be understood that all such modifications are intended to be included within the scope of this invention as defined in the claims. Within the claims, any means-plus-function language is intended to cover the structures described in the present invention as performing the recited function, and not only structural equivalence, but also equivalent structures. The written description and drawings illustrate the present invention and are not to be construed as limited to the specific embodiment disclosed. The present invention is only therefore defined by the following claims, including equivalence thereof.

What is claimed is:

1. A housing for an electronic data module comprising:
   a base section having a plurality of sections comprising:
      a mounting section;
      a tapered section extending outwardly from the mounting section at a predetermined angle and providing a cavity between a mounting surface and the housing when the housing is mounted; and
      a terminal support section provided adjacent the tapered section;
   a terminal disposed and secured within the terminal support section, and an electronic circuit mounted in the cavity whereby the terminal is electrically connected to the electronic circuit.

2. The housing as recited in claim 1, wherein the terminal support section is in perpendicular arrangement with the base section.

3. The housing as recited in claim 1, wherein the terminal is substantially flush with the terminal support section when disposed therein.

4. The housing as recited in claim 1, wherein the base is substantially circular in shape.

5. The housing as recited in claim 1, wherein the tapered section is a frustoconical section extending outwardly from the mounting section.

6. The housing as recited in claim 1, wherein the base and/or center terminal have are of any polygonal or non-polygonal shape.

7. The housing as recited in claim 1, wherein the mounting section, the tapered section, and the terminal support section are integrally formed together from a monolithic material.

8. The housing as recited in claim 1, wherein at least one of the mounting section, the conical section, and the terminal support section are formed from different material than another of the sections.

9. The housing as recited in claim 1, wherein the terminal is electrically isolated from the terminal support section.

10. The housing as recited in claim 1, wherein the mounting section contains an at least one mounting hole that extends through the mounting section.

11. The housing as recited in claim 1, wherein the mounting section, the conical section, and the terminal support section are formed from impact resistant material.

12. The housing as recited in claim 1, wherein the mounting section, the conical section, and the terminal support section are formed from temperature resistant material.

13. The housing as recited in claim 1, wherein the electronic circuit is encased in a potting compound within the cavity.

* * * * *